(12) United States Patent     (10) Patent No.: US 9,405,676 B2
Jeddeloh     (45) Date of Patent: *Aug. 2, 2016

(54) DEVICES AND METHODS FOR OPERATING A SOLID STATE DRIVE

(71) Applicant: Micron Technology, Inc., Boise, ID (US)

(72) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/725,672

(22) Filed: May 29, 2015

(65) Prior Publication Data

US 2015/0261669 A1    Sep. 17, 2015

Related U.S. Application Data

(63) Continuation of application No. 14/045,570, filed on Oct. 3, 2013, now Pat. No. 9,063,846, which is a continuation of application No. 12/127,484, filed on May 27, 2008, now Pat. No. 8,554,983.

(51) Int. Cl.
| | |
|---|---|
| *G06F 12/00* | (2006.01) |
| *G06F 12/02* | (2006.01) |
| *G06F 13/16* | (2006.01) |
| *G06F 12/06* | (2006.01) |
| *G11C 29/00* | (2006.01) |

(52) U.S. Cl.
CPC ........ *G06F 12/0246* (2013.01); *G06F 12/0638* (2013.01); *G06F 13/1668* (2013.01); *G11C 29/765* (2013.01); *G06F 2212/205* (2013.01); *G06F 2212/7211* (2013.01); *Y02B 60/1225* (2013.01); *Y02B 60/1228* (2013.01)

(58) Field of Classification Search
CPC .............. G06F 12/023; G06F 12/0238; G06F 12/0246; G06F 2212/72; G06F 2212/7206; G06F 13/28; G06F 3/0683; G06F 3/0688; G06F 2212/7211
USPC .......................................................... 711/103
See application file for complete search history.

(56) References Cited

U.S. PATENT DOCUMENTS

| | | | |
|---|---|---|---|
| 6,016,275 | A | 1/2000 | Han |
| 6,732,221 | B2 | 5/2004 | Ban |
| 7,363,421 | B2 | 4/2008 | Di Sena et al. |
| 8,010,738 | B1 | 8/2011 | Chilton et al. |
| 2005/0005055 | A1 | 1/2005 | Pasotti et al. |
| 2007/0180328 | A1 | 8/2007 | Cornwell et al. |
| 2007/0233931 | A1 | 10/2007 | Tanaka et al. |
| 2007/0260811 | A1 | 11/2007 | Merry et al. |
| 2007/0276994 | A1 | 11/2007 | Caulkins et al. |
| 2007/0276996 | A1 | 11/2007 | Caulkins et al. |
| 2008/0126720 | A1 | 5/2008 | Danilak |
| 2008/0126891 | A1 | 5/2008 | Danilak |
| 2009/0132778 | A1 | 5/2009 | Danilak |
| 2009/0138671 | A1 | 5/2009 | Danilak |
| 2010/0122200 | A1 | 5/2010 | Merry et al. |

*Primary Examiner* — Prasith Thammavong
(74) *Attorney, Agent, or Firm* — Brooks, Cameron & Huebsch, PLLC

(57) ABSTRACT

The present disclosure includes methods and devices for operating a solid state drive. One method embodiment includes receiving an indication of a desired number of write input/output operations (IOPs) per unit time performed by the solid state drive. The method can also include managing the number of write IOPs performed by the solid state drive at least partially based on the desired number of write IOPs per unit time, a number of spare blocks in the solid state drive, and a desired operational life for the solid state drive.

20 Claims, 4 Drawing Sheets

DEVICES AND METHODS FOR OPERATING A SOLID STATE DRIVE

PRIORITY INFORMATION

This application is a Continuation of U.S. application Ser. No. 14/045,570 filed Oct. 3, 2013, which is a Continuation of U.S. application Ser. No. 12/127,484 filed May 27, 2008, now U.S. Pat. No. 8,554,983, the specification of which are incorporated herein by reference.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Solid state memory devices are utilized as volatile and non-volatile memory for a wide range of electronic applications. Flash memory, which is just one type of solid state memory, typically uses a one-transistor memory cell that allows for high memory densities, high reliability, and low power consumption.

Solid state memory devices, including flash devices, can be combined together to form a solid state drive. A solid state drive can be used to replace hard disk drives as the main storage device for a computer, as the solid state drives can have large storage capacities, including a number of gigabytes. The solid state drives can be coupled together by a controller through a number of channels. Data can be written and read on the number of solid state devices through the channels.

A solid state drive is a data storage device that uses solid state memory to store persistent data. A solid state drive often emulates a hard disk drive (but does not necessarily have to), thus easily replacing it in various applications. A solid state drive can often include either NAND flash non-volatile memory or DRAM volatile memory. Solid state drive manufacturers can use nonvolatile flash memory to create a drive that does not require an internal battery supply thus allowing the drive to be more versatile and compact. Solid state drives using flash memory, also known as flash drives, can use standard disk drive form factors (e.g., 1.8-inch, 2.5-inch, and 3.5-inch, among others). In addition, flash solid state drives can retain memory even during power outages because of their lack of a need for an internal battery, thus ensuring constant data storage ability even when not supplied with power.

Flash solid state drives can have superior performance when compared to magnetic disk drives due to their lack of moving parts, which eliminates seek time, latency, and other electro-mechanical delays associated with magnetic disk drives.

Solid state drives can include wear leveling techniques. These techniques can include rotating the cells in the memory array to which data is written. Wear leveling can also include garbage collection that entails rearranging data on memory arrays to account for the dynamic or static nature of the data. Garbage collection included in the wear leveling techniques can be helpful in managing the wear rate of the individual cells of a memory array. These wear leveling techniques do not limit the amount of data that is written on a solid state drive and they do not account for the rate of writing data and the time period over which data is written on the device as being a factor that can affect the performance of the drive.

In dynamic wear leveling, the data blocks with the highest amount of invalid pages can be reclaimed. A page or block of cells in a memory array can be reclaimed by moving valid data from the page or block from a first location to a second page or block location and erasing the first page or block location. Valid data can be data that is desired and should be preserved in memory cells, while invalid data can be data that no longer is desired and can be erased. A threshold for number of total invalid pages in a block can be set to determine if a block will be reclaimed. Particular blocks can be reclaimed by scanning the block table for blocks that have a number of invalid pages above the threshold. A block table can have information detailing the type, location, and status, among other things, for the data in memory cells.

In static wear leveling, blocks that are storing static data can be exchanged with blocks that have high erase counts so that the blocks with static data, and corresponding lower erase counts, are reclaimed. Blocks that have high erase counts now have static data, therefore reducing the erase rate for that block.

DETAILED DESCRIPTION

The present disclosure includes methods and devices for operating a solid state drive. One method embodiment includes receiving an indication of a desired number of write input/output operations (IOPs) per unit time performed by the solid state drive. The method can also include managing the number of write IOPs performed by the solid state drive at least partially based on the desired number of write IOPs per unit time, a number of spare blocks in the solid state drive, and a desired operational life for the solid state drive.

The number of IOPs performed by the solid state drive that are monitored and managed in various embodiments of the present disclosure can be write IOPs, where data is erased and written on the solid state drive by program and/or erase cycles. In various embodiments, an IOPs request can be made by a controller to write data resulting in a program and/or erase cycle to occur on the solid state drive. A program and/or erase cycle can include a number of memory cells being erased, if necessary, and writing data to a number of memory cells. Solid state drives also can perform a read input/output (IO) operation, where data is retrieved and read by the solid state drive. A read IO operation by the drive does not have to be monitored or managed as a read IO operation should not affect the life of the solid state drive.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
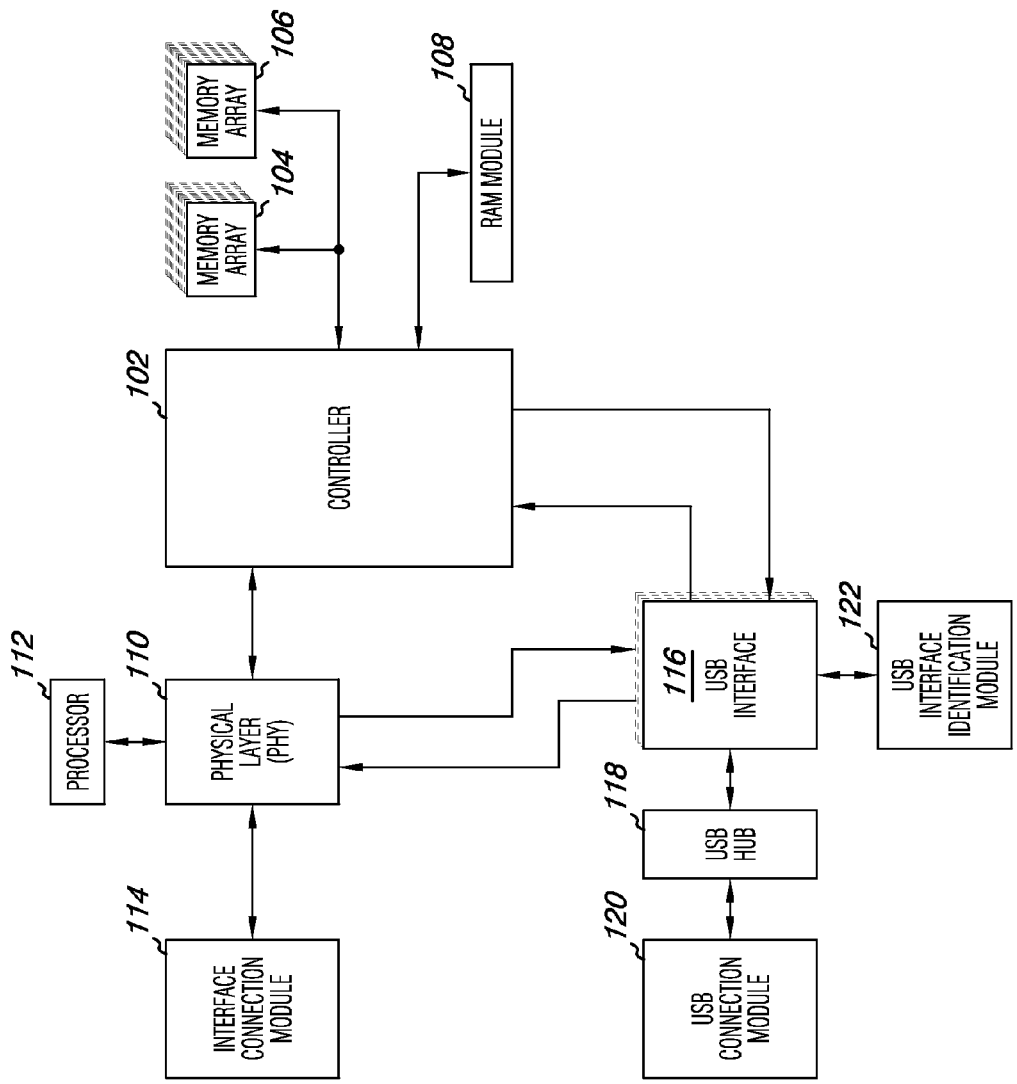
FIG. 1 illustrates a block diagram of a solid state drive configuration in accordance with one or more embodiments of the present disclosure.

FIG. 1 illustrates a block diagram of a solid state drive configuration in accordance with one or more embodiments of the present disclosure. The embodiment of FIG. 1 illustrates the components and architecture of one embodiment of a solid state drive. In the embodiment illustrated in FIG. 1, the solid state drive includes a controller 102 and solid state memory arrays 104, 106, along with a random access memory (RAM) module 108. The solid state memory arrays 104, 106 can be flash memory arrays, among other types of solid state memory arrays. The controller 102 can communicate with the solid state memory arrays 104, 106 to read, write, and erase data on the solid state memory arrays 104, 106. The controller 102 can be used to manage the reading, writing, and erasing of data in the solid state drive based upon inputs to the solid state drive.

In the embodiment illustrated in FIG. 1, the solid state drive also includes a physical layer 110 (PHY) coupled to the controller 102. In various embodiments, the PHY 110 can be a serial advanced technology attachment (SATA), among other interface types. In one or more embodiments, and as illustrated in FIG. 1, the PHY 110 can be coupled to processor 112 and to an interface connection module 114. The PHY 110 allows the controller 102, the solid state memory arrays 104, 106, and the RAM module 108 to communicate with the processor 112 and other external components through the interface connection module 114.

Various embodiments can include a universal serial bus (USB) interface for the solid state drive. For instance, in the embodiment illustrated in FIG. 1, the controller 102 and the PHY 110 are coupled to a USB interface 116. The USB interface 116 is coupled to a USB hub 118 and a USB connection module 120 to allow external devices to be coupled to the solid state drive. In some embodiments, a number of USB interfaces, USB hubs, and USB connection modules can be coupled to the solid state drive allowing for multiple USB device inputs. The USB interface 116 is also coupled to the USB interface identification module 122 to allow for the identification of the USB interfaces that are part of the solid state drive.

Embodiments of the present disclosure can include a number of solid state memory arrays. For instance, in one or more embodiments, the solid state drive can include 16 solid state memory arrays. Embodiments are not limited to a particular number of solid state memory arrays. The solid state memory arrays can be various types of volatile and/or non-volatile memory arrays (e.g., Flash or DRAM arrays, among others). The solid state memory arrays in embodiments of the present disclosure can include a number of channels with a number of memory arrays coupled to each channel. In various embodiments, the memory arrays can be coupled to the controller 102 with 8 channels and 4 memory arrays on each channel. In various embodiments, solid state memory arrays can be partitioned into blocks that consist of 64 or 128 pages, for example, and each page can include 4096 bytes, for example. Embodiments of the present disclosure are not limited to a particular page and/or block size.

In one or more embodiments, the solid state drive can implement wear leveling to control the wear rate on the memory arrays (e.g. 104/106). As one of ordinary skill in the art will appreciate, wear leveling can increase the life of a solid state memory array since a solid state memory array can experience failure after a number of program and/or erase cycles.

In various embodiments, wear leveling can include dynamic wear leveling to minimize the amount of valid blocks moved to reclaim a block. Dynamic wear leveling can include a technique called garbage collection in which blocks with a number of invalid pages (i.e., pages with data that has been re-written to a different page and/or is no longer needed on the invalid pages) are reclaimed by erasing the block. Static wear leveling includes writing static data to blocks that have high erase counts to prolong the life of the block.

In some embodiments, a number of blocks can be designated as spare blocks to reduce the amount of write amplification associated with writing data in the memory array. A spare block can be a block in a memory array that can be designated as a block where data can not be written. Write amplification is a process that occurs when writing data to solid state memory arrays. When randomly writing data in a memory array, the memory array scans for free space in the array. Free space in a memory array can be individual cells, pages, and/or blocks of memory cells that are not programmed. If there is enough free space to write the data, then the data is written to the free space in the memory array. If there is not enough free space in one location, the data in the memory array is rearranged by erasing, moving, and rewriting the data that is already present in the memory array to a new location leaving free space for the new data that is to be written in the memory array. The rearranging of old data in the memory array is called write amplification because the amount of writing the memory arrays has to do in order to write new data is amplified based upon the amount of free space in the memory array and the size of the new data that is to be written on the memory array. Write amplification can be reduced by increasing the amount of space on a memory array that is designated as free space (i.e., where static data will not be written), thus allowing for less amplification of the amount of data that has to be written because less data will have to be rearranged.

In various embodiments, host and/or user traffic and/or program/erase cycles performed by the solid state drive can be monitored, in addition to wear leveling in the solid state drive, to improve performance of the solid state drive. Host and/or user traffic requests can be made by the processor through the controller to read data and/or erase/write data on the solid state drive. Program and/or erase cycles can be monitored to determine the wear rate and life expectancy of the blocks and/or pages in the solid state memory arrays, as a solid state memory arrays can only be erased and written to a finite number of time. Host and/or user traffic trends can be monitored and altered to allow the drive to perform for a desired operational life (e.g., a time period such as hours, days, weeks, years, etc). The solid state drive can monitor and limit the number of program and/or erase cycles performed by the solid state drive, such as to ensure a desired operational life of the drive. The solid state drive can also monitor the number of program and/or erase cycles performed over a particular time period to determine how to calculate the allowable program and/or erase cycle rate for the drive given the a number of space blocks and the desired operational life of the drive.

In addition, in some embodiments, the number of spare blocks in the solid state memory arrays of the solid state drive can be controlled to ensure operability over a desired operational life for a desired number of write IOPs per unit time. The percentage of spare blocks can be optimized for the type of data that is being programmed on the solid state drive. A solid state drive that has static data (i.e., data that is stored on the drive for long periods of time without be erased and/or rewritten) can have a lower percentage of spare blocks because there is less need to reclaim blocks in the drive due to the static nature of the data having fewer program and/or erase cycles. In a solid state drive that has dynamic data (i.e., data that is programmed and/or erased more frequently) a higher percentage of spare blocks can be used to reduce the write amplification associated with having to reclaim blocks to perform program and/or erase cycles in the memory array. In one embodiment, for example, the percentage of spare blocks can be set to less than 20 percent for use with static data. In other embodiments, the percentage of spare blocks can be set to more than 20 percent for use with dynamic data.

In some embodiments, the limits placed on the number of write IOPs performed can be removed for a desired burst period, such as to allow for peak performance during the burst period. The use of the burst period, where the number of write IOPs performed is not limited, can allow the solid state drive to operate to its full capability so a user can utilize the full function of the drive. The burst period can be limited to a defined time period (e.g., one second, one minute, one hour, or one day, etc.). The number of write IOPs performed can be further limited after the burst period to compensate for the extra program and/or erase cycles that occurred during the burst period.

Embodiments of the present disclosure are not limited to the example illustrated in FIG. 1. For example, embodiments can include more or fewer than the two solid state memory arrays 104, 106 illustrated in FIG. 1.

Figure 2:
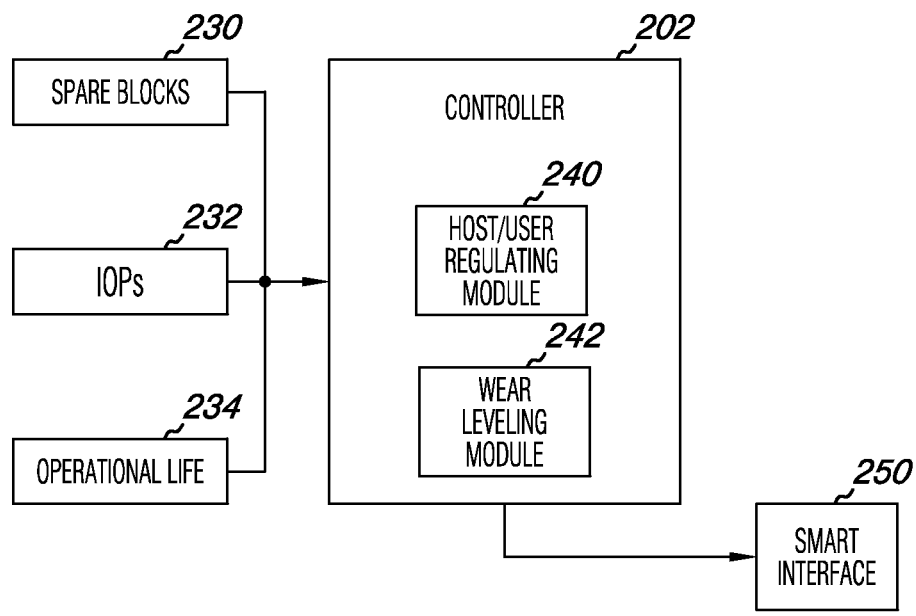
FIG. 2 illustrates a block diagram of a solid state drive operation architecture in accordance with one or more embodiments of the present disclosure.

FIG. 2 illustrates a block diagram of a solid state drive operation architecture in accordance with one or more embodiments of the present disclosure. The embodiment of FIG. 2 illustrates a solid state drive controller 202 with inputs 230, 232, 234 to manage the write IOPs performed by the solid state drive, host and/or user traffic, and/or program and/or erase cycles of the solid state drive. In the embodiment of FIG. 2, input 230 represents the number of spare blocks in a solid state drive, input 232 represents the desired number of write input/output operations (IOPs) per unit time performed by the solid state drive, and input 234 represents the desired operational life for the solid state drive. Inputs 230, 232, and 234 can be selected by a user and/or a managed wear system of a computing device and input to the controller 202. These inputs 230, 232, and 234 are used to manage write IOPs performed by the solid state drive, host and/or user traffic, and/or program and/or erase cycles on the solid state drive, such as to ensure operability over the desired time operational life of the solid state drive.

In various embodiments, once the number of spare blocks in the solid state drive is input to the controller, the host/user traffic regulating module 240 in the controller 202 can monitor the program/erase cycles performed by the solid state drive. In some embodiments, the number of write IOPs performed by the solid state drive can be throttled in a dynamically selectable fashion according the desired operational life and the number of program and/or erase cycles already performed during the solid state drive's life. In various embodiments, the throttling can be done by acknowledging write IOPs requests with increased delay to slow the host and/or user traffic. In various embodiments, throttling the number of write IOPs can control the wear rate of the solid state drive. By limiting the number of write IOPs performed by the solid state drive, the drive's functional life can be extended through the throttling process.

In some embodiments, input 232 for the desired number of write IOPs per unit time performed by the solid state drive can be ignored by the controller 202 for a burst period. During a burst period throttling is not used and an unlimited number of write IOPs can be performed, up to the performance limitations of the solid state drive. A threshold length for the burst period can be set, wherein throttling will be implemented again if host/user traffic requests remain at a level higher than the desired number of write IOPs per unit time for a time period longer than the burst period threshold. In some embodiments, after a burst period, where the number of write IOPs performed is not throttled, the number of write IOPs that can be performed by the solid state drive to ensure its operational life is recalculated via a feedback loop in the host/user regulating module 240 and a new throttling IOPs rate is implemented by the controller 202.

In various embodiments, a wear leveling module 242 can be used by the controller 202 to regulate program and/or erase cycles on the solid state drive by implementing dynamic and static wear leveling. The wear leveling module 242 and the host/user regulating module 240 can be used to shape the performance characteristics of the solid state drive. The data from the wear leveling module 242 and the host/user regulating module 240 can be sent to the self-monitoring, analysis and reporting technology (SMART) interface 250 of the solid state drive, so the operating system that is used to operate the solid state drive can access the performance data of the solid state drive and in turn control performance of the solid state drive to desired levels. In some embodiments, for example, the SMART interface 250 of the solid state drive uses the number of IOPs performed by the solid state drive to determine garbage collection techniques for wear leveling the solid state drive, among other performance controls of the solid state drive.

Figure 3:
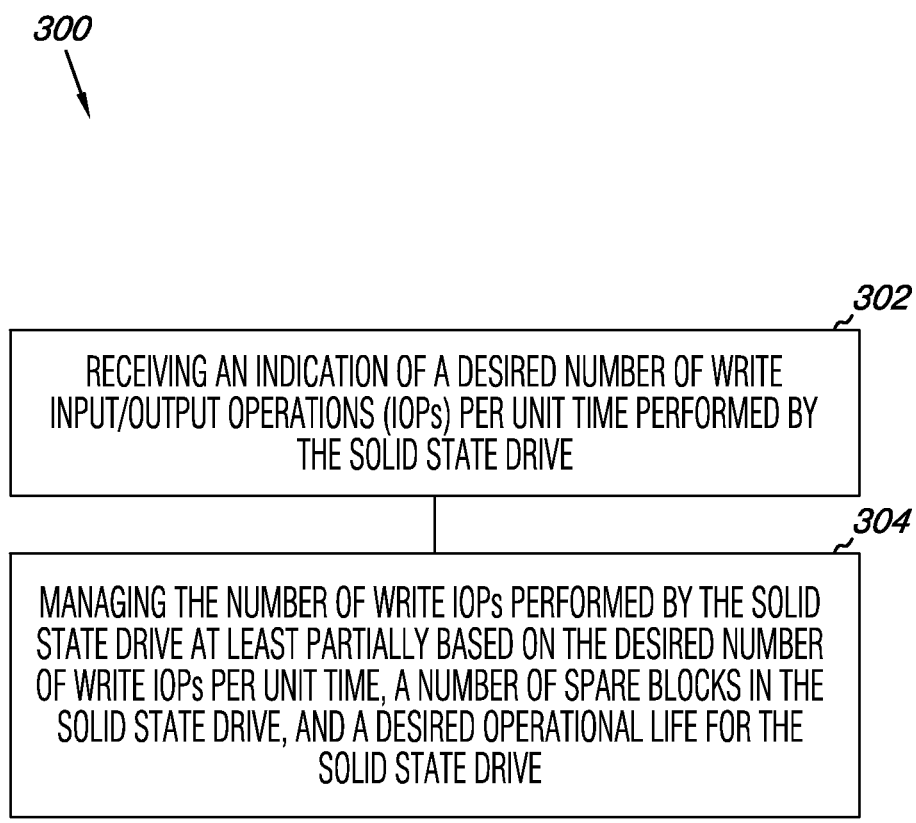
FIG. 3 illustrates a flow diagram for operating a solid state drive according to an embodiment of the present disclosure.

FIG. 3 illustrates a method 300 for operating a solid state drive according to an embodiment of the present disclosure. At block 302, the method includes receiving an indication of a desired number of write input/output operations (IOPs) per unit time performed by the solid state drive. At block 304, the method includes managing the number of write IOPs performed by the solid state drive at least partially based on the desired number of write IOPs per unit time, a number of spare blocks in the solid state drive, and a desired operational life for the solid state drive.

In various embodiments, the method can include setting a number of spare blocks in a solid state drive and a desired operational life for the solid state drive.

In various embodiments, a burst time period can be defined where the number of write IOPs performed by the solid state drive during a burst time period are not limited. A burst period can allow for peak performance of the solid state drive for a limited time period by eliminating the limits on the number of write IOPs performed by the solid state drive. In some embodiments, the limit on the number of write IOPs performed by the solid state drive can be recalculated after the burst time period to compensate for the additional write IOPs performed during the burst period.

In various embodiments, the number of write IOPs performed by the solid state drive can be sent to a self-monitoring, analysis and reporting technology (SMART) interface of the solid state drive. Also, in some embodiments, the number of write IOPs performed by the solid state drive can be incorporated into a wear leveling operation of the solid state drive.

In various embodiments, the solid state drive receiving a number of spare blocks in a solid state drive, a desired number of write input/output operations (IOPs) per unit time performed by the solid state drive, and a desired operational life for the solid state drive can be completed with a user interface associated with the solid state drive. The user interface can allow a user to input the number of spare blocks in a solid state drive, the desired number of write IOPs per unit time performed by the solid state drive, and the desired operational life for the solid state drive to the solid state drive.

Figure 4:
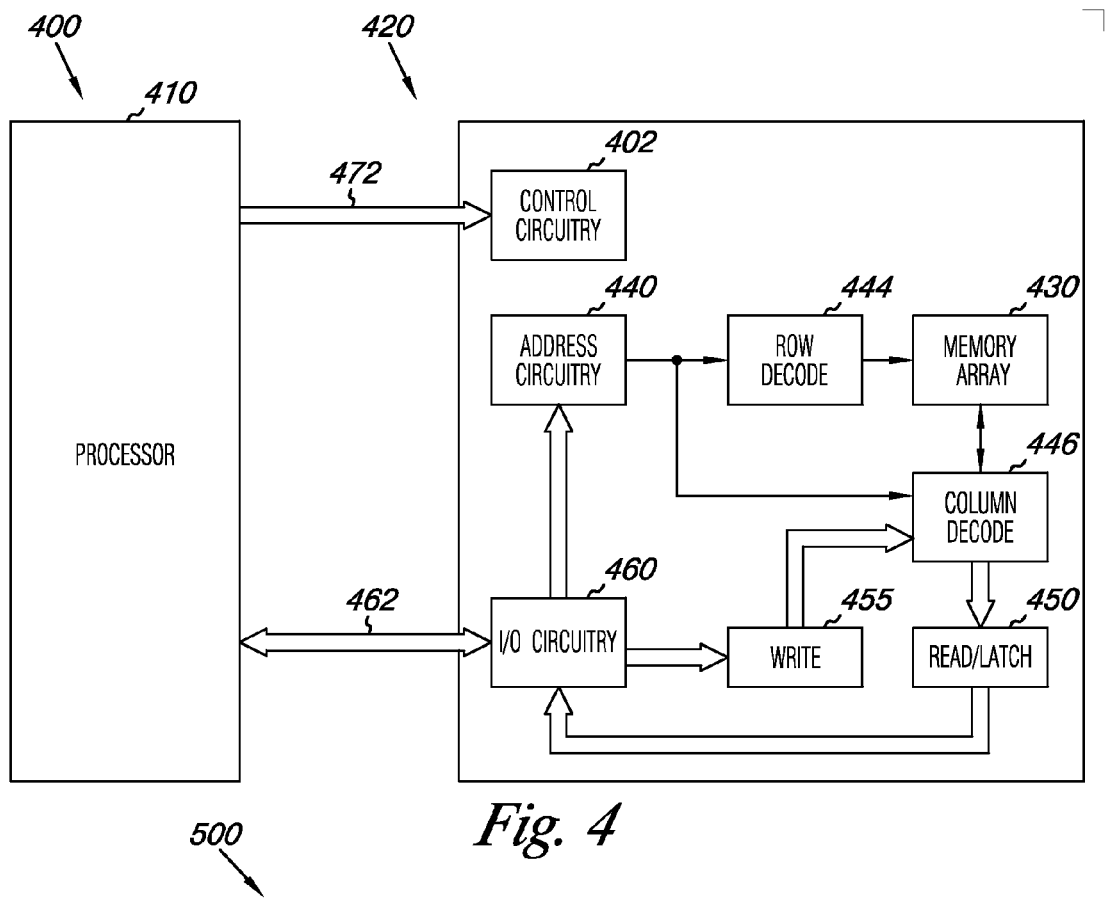
FIG. 4 is a functional block diagram of a solid state drive having at least one memory device operated in accordance with one or more embodiments of the present disclosure.

FIG. 4 is a functional block diagram of a solid state drive system 400 having at least one memory device 420 operated in accordance with one or more embodiments of the present disclosure. Solid state drive system 400 includes a processor 410 coupled to a non-volatile memory device 420 that includes a memory array 430 of non-volatile cells. The solid state drive system 400 can include separate integrated circuits or both the processor 410 and the memory device 420 can be on the same integrated circuit. The processor 410 can be a microprocessor or some other type of controlling circuitry such as an application-specific integrated circuit (ASIC).

The memory device 420 includes an array of non-volatile memory cells 430, which can be floating gate flash memory cells with a NAND architecture. The control gates of memory cells of a "row" are coupled with a select line, while the drain regions of the memory cells of a "column" are coupled to sense lines. The source regions of the memory cells are coupled to source lines. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 4 includes address circuitry 440 to latch address signals provided over I/O connections 462 through I/O circuitry 460. Address signals are received and decoded by a row decoder 444 and a column decoder 446 to access the memory array 430. It will be appreciated by those skilled in the art that the number of address input connections depends on the density and architecture of the memory array 430 and that the number of addresses increases with both increased numbers of memory cells and increased numbers of memory blocks and arrays.

The memory device 420 senses data in the memory array 430 by sensing voltage and/or current changes in the memory array columns using sense/buffer circuitry that in this embodiment can be read/latch circuitry 450. The read/latch circuitry 450 can read and latch a page, e.g., a row or a portion of a row, of data from the memory array 430. I/O circuitry 460 is included for bi-directional data communication over the I/O connections 462 with the processor 410. Write circuitry 455 is included to write data to the memory array 430.

Control circuitry 402 decodes signals provided by control connections 472 from the processor 410. These signals can include chip signals, write enable signals, and address latch signals that are used to control the operations on the memory array 430, including data sensing, data write, and data erase operations. The control circuitry 402 can issue commands and/or send signals to selectively reset particular registers and/or sections of registers according to one or more embodiments of the present disclosure. In one or more embodiments, the control circuitry 402 is responsible for executing instructions from the processor 410 to perform the operations according to embodiments of the present disclosure. The control circuitry 402 can be a state machine, a sequencer, or some other type of controller. It will be appreciated by those skilled in the art that additional circuitry and control signals can be provided, and that the memory device detail of FIG. 4 has been reduced to facilitate ease of illustration.

Figure 5:
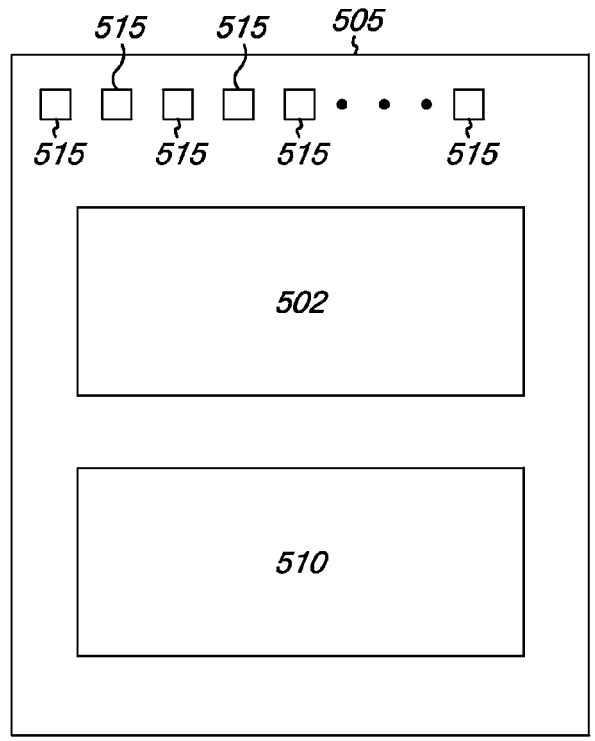
FIG. 5 is a functional block diagram of a solid state memory module having at least one memory device in a solid state drive in accordance with one or more embodiments of the present disclosure.

FIG. 5 is a functional block diagram of a solid state memory module 500 having at least one memory array operated in accordance with one or more embodiments of the present disclosure. Memory module 500 is illustrated as a number of memory arrays with a controller and control circuitry, although the concepts discussed with reference to memory module 500 are applicable to any type of solid state memory and are intended to be within the scope of "memory module" used herein as part of the solid state drive. In addition, although one example form factor is depicted in FIG. 5, these concepts are applicable to other form factors as well. A solid state drive can have a number of solid state memory arrays. In FIG. 5, the solid state memory array 510 can be any type of solid state memory including flash, DRAM, SDRAM, and SRAM, among other types of solid state memory.

In some embodiments, the solid state memory arrays can be coupled together in the solid state drive with a number of channels. In one embodiment, a solid state drive can have eight channels with four solid state memory arrays on each channel for a total of 32 solid state memory arrays in a solid state memory device.

In some embodiments, a solid state drive can include a controller 502 to manage host and/or use traffic on the solid state drive. The controller 502 can route host/user traffic to the number of solid state memory arrays. The controller 502 can limit the number of write IOPs performed by the solid state drive to manage the wear on the solid state drive. Limiting the number of write IOPs performed can be used to manage the wear rate of the memory arrays in the solid state drive.

In one or more embodiments, memory module 500 can include a housing 505 to enclose memory array 510, though such housing is not essential to a solid state drive. The memory module 500 can be included in a solid state drive, wherein a number of memory modules, with their memory cell arrays, provide the memory arrays for the solid state drive. The memory array 510 can include an array of non-volatile multilevel memory cells that can be sensed according to embodiments described herein. Where present, the housing 505 includes one or more contacts 515 for communication with a solid state drive, a personal computer, or other devices that require electronic memory. In general, however, contacts 515 provide an interface for passing control, address and/or data signals between the memory module 500 and a solid state drive having compatible receptors for the contacts 515.

The memory module 500 may optionally include controller 502 which can have additional circuitry that may be one or more integrated circuits and/or discrete components. For one or more embodiments, the additional circuitry in controller 502 may include control circuitry for controlling access across a number of memory arrays and/or for providing a translation layer between an external host and the memory module 500. For example, there may not be a one-to-one correspondence between the number of contacts 515 and a number of connections to the number of memory arrays. Thus, a memory controller could selectively couple an I/O connection (not shown in FIG. 10) of a memory array to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory array 510. Memory controller 502 could then translate the command sequences received from a host into the appropriate command sequences to achieve the desired access to the memory array 510. Such translation may further include changes in signal voltage levels in addition to command sequences.

The additional circuitry of controller 502 may further include functionality unrelated to control of a memory array 510 such as logic functions as might be performed by an ASIC. Also, the additional circuitry of controller 502 may include circuitry to restrict read or write access to the memory module 500, such as password protection, biometrics or the like. The additional circuitry of controller 502 may include circuitry to indicate a status of the memory module 500. For example, the additional circuitry of controller 502 may include functionality to determine whether power is being supplied to the memory module 500 and whether the memory module 500 is currently being accessed, and to display an indication of its status, such as a solid light while powered and a flashing light while being accessed. The additional circuitry of controller 502 may further include passive devices, such as decoupling capacitors to help regulate power requirements within the memory module 500.

CONCLUSION

The present disclosure includes methods and devices for operating a solid state drive. One method embodiment includes receiving an indication of a desired number of write input/output operations (IOPs) per unit time performed by the solid state drive. The method can also include managing the number of write IOPs performed by the solid state drive at least partially based on the desired number of write IOPs per unit time, a number of spare blocks in the solid state drive, and a desired operational life for the solid state drive.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   managing, by a controller of a solid state memory device, a number of operations performed by the solid state drive and a number of spare blocks in the solid state drive at least partially based on each of:
   a user indicated number of write input/output operations (IOPs) per unit time;
   a user indicated number of spare blocks in the solid state drive; and
   a user indicated operational life for the solid state drive.

2. The method of claim 1, wherein managing the number of operations performed by the solid state drive includes limiting the number of write IOPs performed by the solid state drive.

3. The method of claim 1, wherein managing the number of operations performed by the solid state drive includes limiting the number of write IOPs performed by the solid state drive to have the solid state drive perform the user indicated number of write IOPs per unit time.

4. The method of claim 1, further including not limiting the number of write IOPs performed during a burst time period.

5. The method of claim 4, wherein managing the number of operations performed by the solid state drive further includes limiting the number of write IOPs at least partially based on the number of write IOPs performed during the burst time period.

6. The method of claim 1, further including sending the number of write IOPs performed by the solid state drive to a self-monitoring, analysis and reporting technology (SMART) interface of the solid state drive.

7. The method of claim 1, further including performing a wear leveling operation on the solid state drive at least partially based on the number of write IOPs performed by the solid state drive.

8. The method of claim 1, further including receiving an indication of the number of spare blocks in the solid state drive and an indication of the operational life for the solid state drive.

9. The method of claim 8, wherein receiving an indication of a number of write IOPs per unit time performed by the solid state drive, the indication of the number of spare blocks in the solid state drive, and the indication of the operational life for the solid state drive comprises receiving the indications from a user through a user interface associated with the solid state drive.

10. A method, comprising:
    setting a number of write input/output operations (IOPs) per unit time to be performed by a solid state drive at least partially based on a user indicated amount of spare blocks and at least partially based on a user indicated operation life; and
    managing, by a controller of the solid state memory device, write IOPs performed by the solid state drive and a number of spare blocks in the solid state drive at least partially based on each of: the set number of write per unit time to be performed by the solid state drive, the user indicated amount of spare blocks, and the user indicated operational life for the solid state drive to allow the solid state drive to perform for the user indicated operational life.

11. The method of claim 10, wherein managing further includes not limiting the number of write IOPs performed by the solid state drive over a number of burst periods.

12. The method of claim 11, wherein managing further includes compensating for the number of write IOPs performed during the number of burst periods by further limiting a future number of write IOPs performed by the solid state drive.

13. The method of claim 10, wherein managing further includes allowing a limited number of write IOPs to be performed over a period of time.

14. The method of claim 10, further including managing a number of spare blocks in the solid state drive at least partially based on the user indicated operational life.

15. The method of claim 10, wherein setting the amount of spare blocks includes setting a percentage of spare blocks.

16. A solid state memory device, comprising:
a number of solid state memory arrays; and
a controller coupled to the number of solid state memory arrays and configured to:
receive a user indication of a number of spare blocks in the number of solid state memory arrays,
receive a user indication of a number of write IOPs per unit time,
receive a user indication of an operational life for the number of solid state memory arrays, and
manage write input/outputs operations (IOPs) performed by the number of solid state memory arrays and a number of spare blocks in the number of solid state memory arrays at least partially based on each of the number of spare blocks in the solid state memory arrays, the number of write TOPS per unit time, and the operational life for the number of solid state memory arrays.

17. The solid state memory device of claim 16, wherein the controller manages a rate at which the number of write IOPs are performed by the number of solid state memory arrays based, at least partially, upon the number of spare blocks in the solid state drive and the operational life for the solid state memory arrays.

18. The solid state memory device of claim 16, wherein the controller dynamically manages host traffic on the solid state device to reduce wear of the number of solid state memory arrays.

19. The solid state memory device of claim 18, wherein the controller dynamically manages host traffic on the solid state device by acknowledging write IOPs requests with increased delay.

20. The solid state memory device of claim 16, wherein the controller is configured to perform a wear leveling operation that is at least partially based on the number of write IOPs performed by the solid state drive.

* * * * *